US010176879B2

(12) United States Patent
Lee et al.

(10) Patent No.: US 10,176,879 B2
(45) Date of Patent: Jan. 8, 2019

(54) HIGH VOLTAGE SWITCH CIRCUIT AND SEMICONDUCTOR MEMORY DEVICE INCLUDING THE SAME

(71) Applicant: SK hynix Inc., Gyeonggi-do (KR)

(72) Inventors: Dong Hwan Lee, Gyeonggi-do (KR); Min Gyu Koo, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/453,367

(22) Filed: Mar. 8, 2017

(65) Prior Publication Data

US 2018/0075915 A1    Mar. 15, 2018

(30) Foreign Application Priority Data

Sep. 13, 2016   (KR) .................. 10-2016-0117804

(51) Int. Cl.
*G11C 16/30*  (2006.01)
*H03K 17/687*  (2006.01)
*H03K 17/10*  (2006.01)

(52) U.S. Cl.
CPC ......... *G11C 16/30* (2013.01); *H03K 17/6872* (2013.01); *H03K 17/6877* (2013.01); *H03K 17/102* (2013.01); *H03K 2017/6875* (2013.01); *H03K 2217/0018* (2013.01); *H03K 2217/0054* (2013.01)

(58) Field of Classification Search
CPC ..................... G11C 16/30; H03K 17/6872
See application file for complete search history.

(56) References Cited

U.S. PATENT DOCUMENTS

| 5,905,402 | A  | * | 5/1999 | Kim ................. | H02M 3/07 |
| | | | | | 326/81 |
| 6,356,137 | B1 | * | 3/2002 | Roohparvar ........ | G11C 5/145 |
| | | | | | 327/390 |
| 7,592,858 | B1 | * | 9/2009 | Jung ................. | H03K 5/08 |
| | | | | | 327/333 |
| 8,427,869 | B2 | * | 4/2013 | Lee .................. | G11C 8/08 |
| | | | | | 327/427 |
| 8,502,591 | B2 | * | 8/2013 | Jang ................. | G11C 16/08 |
| | | | | | 326/61 |
| 2007/0139077 | A1 | * | 6/2007 | Park ................. | G11C 16/08 |
| | | | | | 326/80 |
| 2009/0085646 | A1 | * | 4/2009 | Ha .................. | G11C 29/1201 |
| | | | | | 327/408 |
| 2009/0185422 | A1 | * | 7/2009 | Kang ................ | G11C 7/02 |
| | | | | | 365/185.11 |

(Continued)

FOREIGN PATENT DOCUMENTS

KR  1020080056635  6/2008
KR  1020130095559  8/2013

*Primary Examiner* — Douglas King
(74) *Attorney, Agent, or Firm* — IP & T Group LLP

(57) ABSTRACT

Disclosed are a high voltage switch circuit and a semiconductor memory device including the same. The high voltage switching circuit includes: a control signal generating circuit configured to supply a supply voltage to an internal node and generate a control signal in response to a first enable signal; a well bias generating circuit configured to apply a well bias to a well of a transistor included in the control signal generating circuit in response to a second enable signal; and a switching circuit configured to switch an input voltage to an output voltage in response to the control signal.

11 Claims, 6 Drawing Sheets

(56) References Cited

U.S. PATENT DOCUMENTS

| | | | |
|---|---|---|---|
| 2011/0051520 A1* | 3/2011 | Kim .................... | G11C 11/5628 365/185.19 |
| 2014/0204676 A1* | 7/2014 | Kim ....................... | G11C 16/30 365/185.18 |
| 2016/0078942 A1* | 3/2016 | Lee ......................... | G11C 8/12 365/185.11 |

* cited by examiner

HIGH VOLTAGE SWITCH CIRCUIT AND SEMICONDUCTOR MEMORY DEVICE INCLUDING THE SAME

CROSS-REFERENCE TO RELATED APPLICATION

This U.S. non-provisional patent application claims priority under 35 U.S.C. § 119(a) to Korean patent application number 10-2016-0117804 filed on Sep. 13, 2016 in the Korean Intellectual Property Office (KIPO), the disclosure of which is herein incorporated by reference in its entirety.

BACKGROUND

1. Field

The present disclosure relates to an electronic device, and more particularly, to a high voltage switch circuit and a semiconductor memory device including the same.

2. Description of the Related Art

Semiconductor devices, in particular, semiconductor memory devices are classified into volatile memory devices and nonvolatile memory devices.

Nonvolatile memory devices can maintain data stored therein even when power supply is interrupted, although they generally have lower read and write speeds than volatile memory devices. Therefore, nonvolatile memory devices are used when there is the need for storing data which must be maintained regardless of the status of the power supply. Representative examples of nonvolatile memory devices include read-only memory (ROM), mask ROM (MROM), programmable ROM (PROM), erasable programmable ROM (EPROM), electrically erasable programmable ROM (EEPROM), flash memory, phase-change random access memory (PRAM), magnetic RAM (MRAM), resistive RAM (RRAM), Ferroelectric RAM (FRAM), etc. A flash memory may be a NOR flash memory or a NAND flash memory.

A flash memory combines advantages of both a RAM in which data is programmable and erasable and advantages of a ROM in which data stored therein can be retained even when power is interrupted. Flash memories are used widely as a storage medium of portable electronic devices such as a digital camera, a PDA (Personal Digital Assistant) and an MP3 player.

SUMMARY

The present disclosure provides a high voltage switch circuit having a decreased size, and a semiconductor memory device including the same.

An exemplary embodiment of the present disclosure provides a high voltage switching circuit, including: a control signal generating circuit configured to supply a supply voltage to an internal node and generate a control signal in response to a first enable signal; a well bias generating circuit configured to apply a well bias to a well of a transistor included in the control signal generating circuit in response to a second enable signal; and a switching circuit configured to switch an input voltage to an output voltage in response to the control signal.

Another exemplary embodiment of the present disclosure provides a semiconductor memory device, including: a memory cell array including a plurality of memory cells; a path circuit configured to switch word lines and global word lines of the memory cell array in response to a block select signal; and a block switch configured to generate the block select signal in response to an address signal, in which the block switch includes a well bias generating circuit for applying a well bias to a well of a transistor for applying a supply voltage to an internal node.

Another exemplary embodiment of the present disclosure provides a high voltage switching circuit, including: a control signal generating circuit including a depletion transistor and a high voltage PMOS transistor serially connected between a terminal to which a high voltage is applied and a first internal node, the depletion transistor supplying the high voltage to a second internal node between the depletion transistor and the high voltage PMOS transistor in response to a potential level of the fist internal node and wherein a gate of the high voltage PMOS transistor controls transfer of a voltage supplied through the depletion transistor to the first internal node in response to a first enable signal; a well bias generating circuit suitable for applying a well bias to the second internal node in response to a second enable signal, the well bias having a voltage level lower than a threshold voltage of the high voltage PMOS transistor; and a switching circuit suitable for switching an input voltage according to the potential level of the first node and outputting an output voltage.

According to the exemplary embodiments of the present disclosure, it is possible to decrease an entire of the high voltage switch circuit by decreasing a size of a transistor of a high voltage switch circuit. Further, it is possible to improve the degree of integration by decreasing an interval between the wells of the transistors.

BRIEF DESCRIPTION OF THE DRAWINGS

These and other features and advantages of the present invention will become apparent to those skilled in the art to which the present invention pertains from the following detailed description with reference to the accompanying drawings in which.

DETAILED DESCRIPTION

Figure 1:
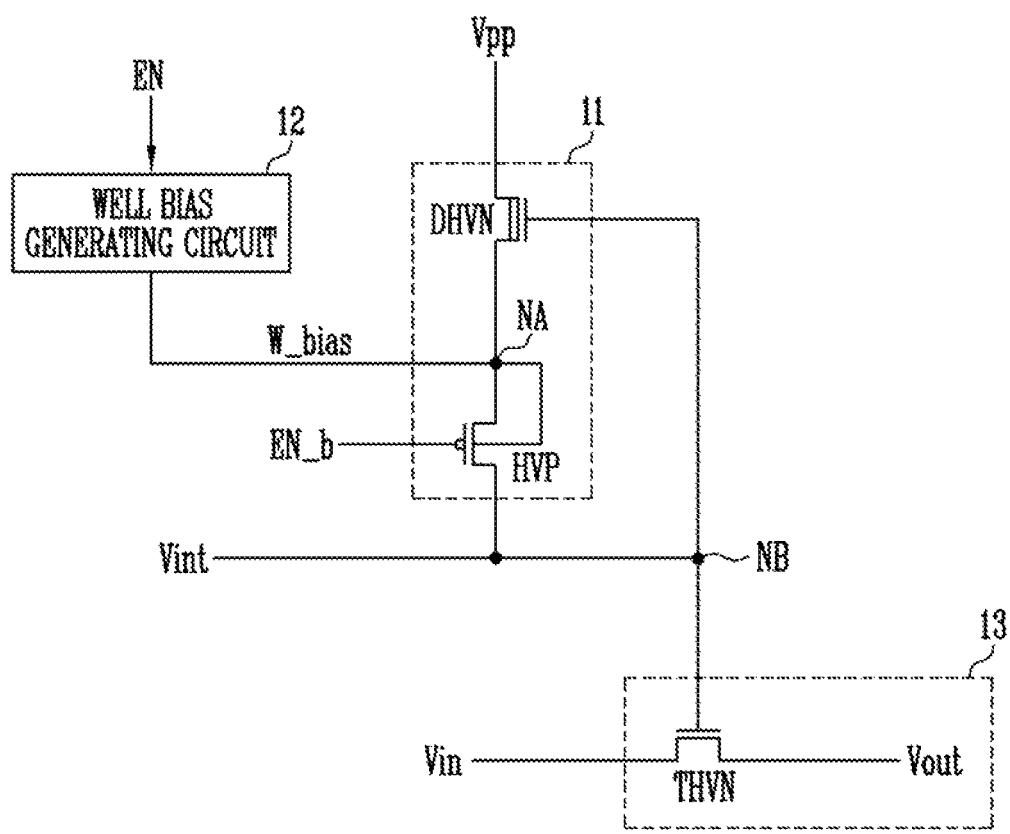
FIG. 1 is a circuit diagram illustrating a high voltage switch circuit according to an exemplary embodiment of the present disclosure.

Hereinafter, various embodiments of the present invention will be described in greater detail with reference to the accompanying drawings. However, it is noted that the present invention may be embodied in different other embodiments and forms and should not be construed as limited only to the embodiments set forth herein. Rather, these embodiments are provided so that this disclosure will be thorough and complete, and will fully convey the invention to those skilled in the art.

In the drawing figures, dimensions may be exaggerated for clarity of illustration.

Embodiments are described herein with reference to simplified schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural form as long as it is not stated otherwise in a sentence. Furthermore, the terms "include," "comprise," "including," and "comprising" as used in the specification and the claims are inclusive terms referring to one or more stated elements and do not preclude the addition of other elements.

Furthermore, unless defined otherwise, all the terms used in this specification including technical and scientific terms have the same meanings as would be generally understood by those skilled in the related art in view of the present disclosure. The terms defined in generally used dictionaries should be construed as having the same meanings as would be construed in the context of the present disclosure and the related art, and unless clearly defined otherwise in this specification, should not be construed as having idealistic or overly formal meanings.

It is also noted that in this specification, that "connected" or "coupled" refers to one component not only directly coupled to another component but also indirectly coupled to another component through an intermediate component. On the other hand, "directly connected" or "directly coupled" refers to one component directly coupled to another component without an intermediate component.

It will be understood that when an element is referred to as being "between" two elements, it can be the only element between the two elements, or one or more intervening elements may also be present It is further noted that in the following description, specific details are set forth for facilitating the understanding of the present invention, however, the present invention may be practiced without some of these specific details. Also, it is noted, that well-known structures and/or processes may have only been described briefly or not described at all to avoid obscuring the present disclosure with unnecessary well known details.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

FIG. 1 is a circuit diagram illustrating a high voltage switch circuit 10 according to an exemplary embodiment of the present disclosure.

Referring to FIG. 1, the high voltage switch circuit 10 includes a control signal generating circuit 11, a well bias generating circuit 12, and a switching circuit 13.

The control signal generating circuit 11 includes a depletion transistor DHVN and a high voltage PMOS transistor HVP.

The depletion transistor DHVN and the high voltage PMOS transistor HVP are serially connected between a terminal, to which a high voltage Vpp is applied, and an internal node NB.

A gate of the depletion transistor DHVN is connected to the internal node NB. The depletion transistor DHVN supplies the high voltage Vpp to an internal node NA between the depletion transistor DHVN and the high voltage PMOS transistor HVP in response to a potential level of the internal node NB. A gate of the high voltage PMOS transistor HVP controls transfer of a voltage supplied through the depletion transistor DHVN to the internal node NB in response to a first enable signal EN_b. A well of the high voltage PMOS transistor HVP is connected with the internal node NA. The potential level of the internal node NB may be output as a control signal.

An initial voltage Vint may be applied to the internal node NB during an initial operation. The initial voltage Vint may be a positive voltage or a zero voltage, i.e., Vint≥0 V. For example, the initial voltage Vint may be a positive voltage during a turn-on operation of the high voltage switching circuit 10 and may be 0 V during a turn-off operation of the high voltage switching circuit 10.

The well bias generating circuit 12 applies a well bias W_bias to the node NA in response to a second enable signal EN. The well bias W_bias may have a voltage level that is lower than that of a threshold voltage of the high voltage PMOS transistor HVP. The second enable signal EN may have a reverse relation with the first enable signal EN_b.

A Breakdown Voltage (BV) characteristic is improved by Drain-Induced Barrier Lowering (DIBL) of the high voltage PMOS transistor HVP according to the well bias W_bias applied to the well of the high voltage PMOS transistor HVP. Accordingly, it is possible to design the high voltage PMOS transistor HVP having a decreased size by applying the well bias W_bias to the well of the high voltage PMOS transistor HVP.

The switching circuit 13 switches an input voltage Vin according to the potential level of the node NB of the control signal generating circuit 11 and outputs an output voltage Vout. The switching circuit 13 may include a triple well transistor THVN with the gate of the triple well transistor coupled to the internal node NB.

An operation of the high voltage switch circuit 10 according to the present disclosure will be divided into a turn-on operation and a turn-off operation as follows.

1) Turn-on Operation (Input Voltage Transmission Operation)

During the turn-on operation, the first enable signal EN_b is applied at a logic low level and the second enable signal EN is applied at a logic high level.

The depletion transistor DHVN of the control signal generating circuit 11 applies a current of a predetermined level to the node NA through the terminal of the high voltage Vpp in response to the potential level of the internal node NB, to which the initial voltage Vint is applied.

The well bias generating circuit 12 is inactivated in response to the second enable signal EN at the logic high level. Accordingly, the well bias generating circuit 12 does not generate and output the well bias W-Bias during the turn on operation period.

The high voltage PMOS transistor HVP of the control signal generating circuit 11 is turned on in response to the first enable signal EN_b at the logic low level. Accordingly, a current of the node NA is transmitted to the internal node NB, and thus the potential level of the node NB is increased by a predetermined amount. Accordingly, the quantity of current flowing through the depletion transistor DHVN is gradually increased, so that the potential level of the node NB is increased up to a level of the high voltage Vpp.

The switching circuit 13 is turned on in response to the potential level of the internal node NB reaching at the level of the high voltage Vpp. Accordingly, the switching circuit 13 switches the input voltage Vint to the output voltage Vout.

2) Turn-Off Operation (Input Voltage Blocking Operation)

During the turn-off operation, the first enable signal EN_b is applied at the logic high level and the second enable signal EN is applied at the logic low level.

The depletion transistor DHVN of the control signal generating circuit 11 is turned off in response to the potential level of the internal node NB, to which the initial voltage Vint is applied.

The well bias generating circuit 12 is activated in response to the second enable signal EN at the logic low level. Accordingly, the well bias generating circuit 12 generates a well bias W-Bias and outputs the well bias W-Bias to the node NA.

The high voltage PMOS transistor HVP of the control signal generating circuit 11 is turned off in response to the first enable signal EN_b at the logic high level. Further, the well bias W-Bias is applied to the well of the high voltage PMOS transistor HVP.

Since the depletion transistor DHVN and the high voltage PMOS transistor HVP of the control signal generating circuit 11 are in the turn-off state, the potential level of the internal node NB is maintained at a level of the initial voltage Vint.

The switching circuit 13 is turned off in response to the potential level of the Internal node NB at the level of the initial voltage Vint.

Hence, according to the exemplary embodiment of FIG. 1, the high voltage switch circuit applies the well bias to the well of the high voltage PMOS transistor HVP, which switches a high voltage, thereby improving a BV characteristic of the high voltage PMOS transistor HVP when the high voltage switch circuit performs the turn-off operation.

In the exemplary embodiment of FIG. 1, one high voltage switch circuit is disclosed, however, we note that the invention is not limited in this way. For example, a plurality of high voltage switch circuits having the aforementioned structure of FIG. 1 in an area adjacent to each other. In an embodiment, each of the plurality of high voltage switch circuits may include one well bias generating circuit 12. In another embodiment, the plurality of high voltage switch circuits may be designed to share one well bias generating circuit 12. When the plurality of high voltage switch circuits share one well bias generating circuit 12, the second enable signal EN activating the well bias generating circuit 12 may not have a reverse relation with the first enable signal EN_b. For example, the second enable signal EN may be designed to activate the well bias generating circuit 12 when at least one of the plurality of high voltage switch circuits is in a disable state.

When plurality of high voltage switch circuits is employed, a well bias may be applied to the well of the high voltage PMOS transistor HVP included in an inactivated high voltage switch circuit, so that the adjacent high voltage switch circuit is activated and a capacitance phenomenon is decreased even though a potential level of the well is increased by a high voltage switching operation of the high voltage PMOS transistor HVP. Accordingly, it is possible to improve the degree of integration of the circuit by decreasing an interval between the wells of the high voltage PMOS transistors HVP of two adjacent high voltage switch circuits.

Figure 2:
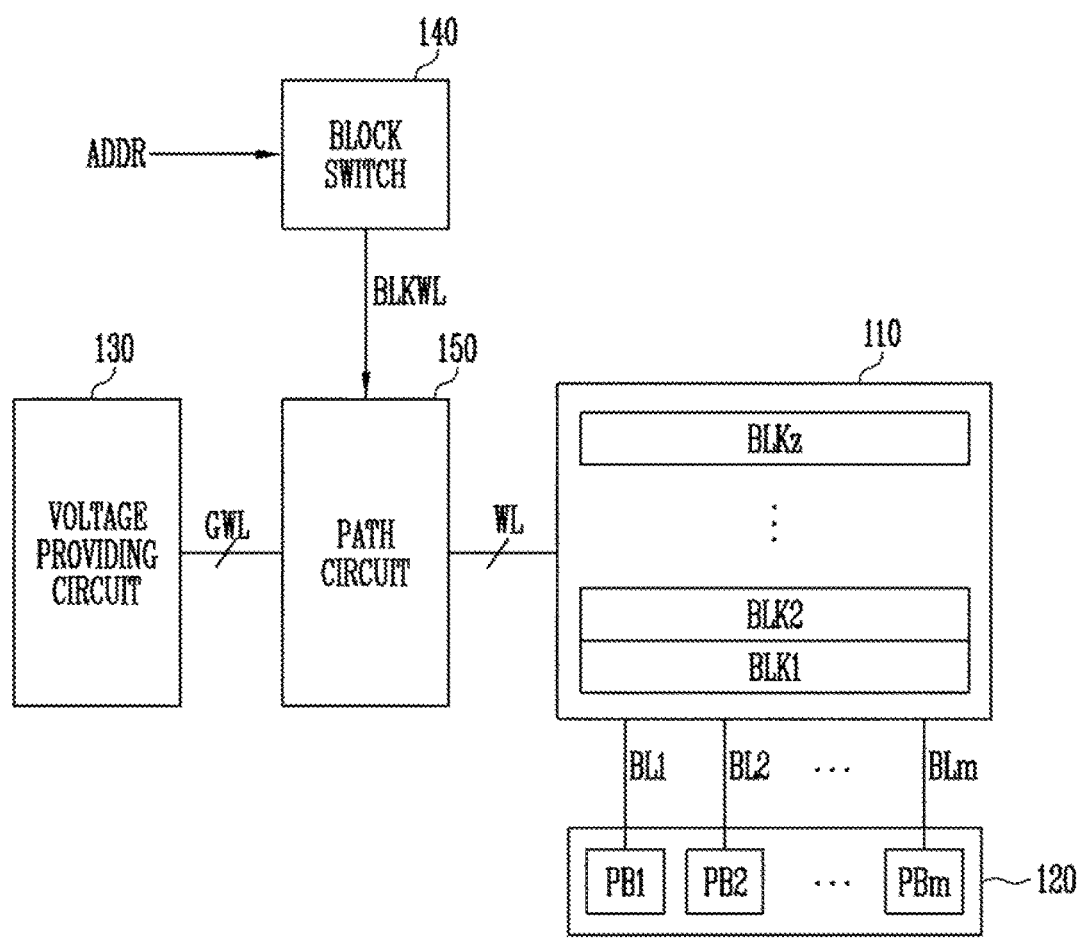
FIG. 2 is a block diagram illustrating a semiconductor memory device according to an exemplary embodiment of the present disclosure.

FIG. 2 is a block diagram illustrating a semiconductor memory device, according to an exemplary embodiment of the present disclosure.

Referring to FIG. 2, a semiconductor memory device 100 may include a memory cell array 110, a read and write circuit 120, a voltage providing circuit 130, a block switch 140, and a path circuit 150.

The memory cell array 110 may include a plurality of memory blocks BLK1 to BLKz. Each of the plurality of memory blocks BLK1 to BLKz may be connected to the path circuit 150 through a plurality of local lines including a plurality of word lines WL, and other lines such as local drain and source select lines (see FIG. 4). The plurality of memory blocks BLK1 to BLKz is connected to the read and write circuit 120 through bit lines BL1 to BLm. Each of the memory blocks BLK1 to BLKz includes a plurality of memory cells. As an exemplary embodiment, the plurality of memory cells may be non-volatile memory cells. More particularly, the plurality of memory cells may be non-volatile memory cells based on a charge trap device. Memory cells connected to the same word line among the plurality of memory cells may be defined as a page. That is, the memory cell array 110 is formed of a plurality of pages organized in memory blocks. Further, each of the plurality of memory blocks BLK1 to BLKz of the memory cell array 110 may include a plurality of cell strings. Each of the memory strings may include a drain select transistor cell, a plurality of memory cells, and a source select transistor cell, which may be serially connected between the bit line and a source line.

The read and write circuit 120 may include a plurality of page buffers PB1 to PBm. The plurality of page buffers PB1 to PBn may be connected to the memory cell array 110 through the bit lines BL1 to BLm. Each of the plurality of page buffers PB1 to PBm may temporarily store program data during a program operation, and then may adjust potential levels of the bit lines BL1 to BLm according to the temporarily stored data. Further, during a read operation, the read and write circuit 120 may sense a potential level or a current of the bit lines BL1 to BLm and read data stored in the memory cells.

The voltage providing circuit 130 may generate a plurality of operation voltages to be provided to the memory cell array 110, and may output the generated operation voltages through global word lines GWL. The operation voltages may differ depending on the operation to be performed. For example, the voltage generating circuit 130 may generate a program voltage and a pass voltage during a program operation, or may generate a read voltage and a pass voltage during a read operation.

The block switch 140 outputs a block select signal BLKWL in response to an address signal ADDR.

The path circuit 150 may be connected between the global word lines GWL and the plurality of word lines WL of the memory cell array 110, and may connect the global word lines GWL and the word lines WL. The path circuit 150 may receive the operation voltages generated by the voltage providing circuit 130 through the global word lines GWL and may then apply the operation voltages to the word lines WL.

Figure 3:
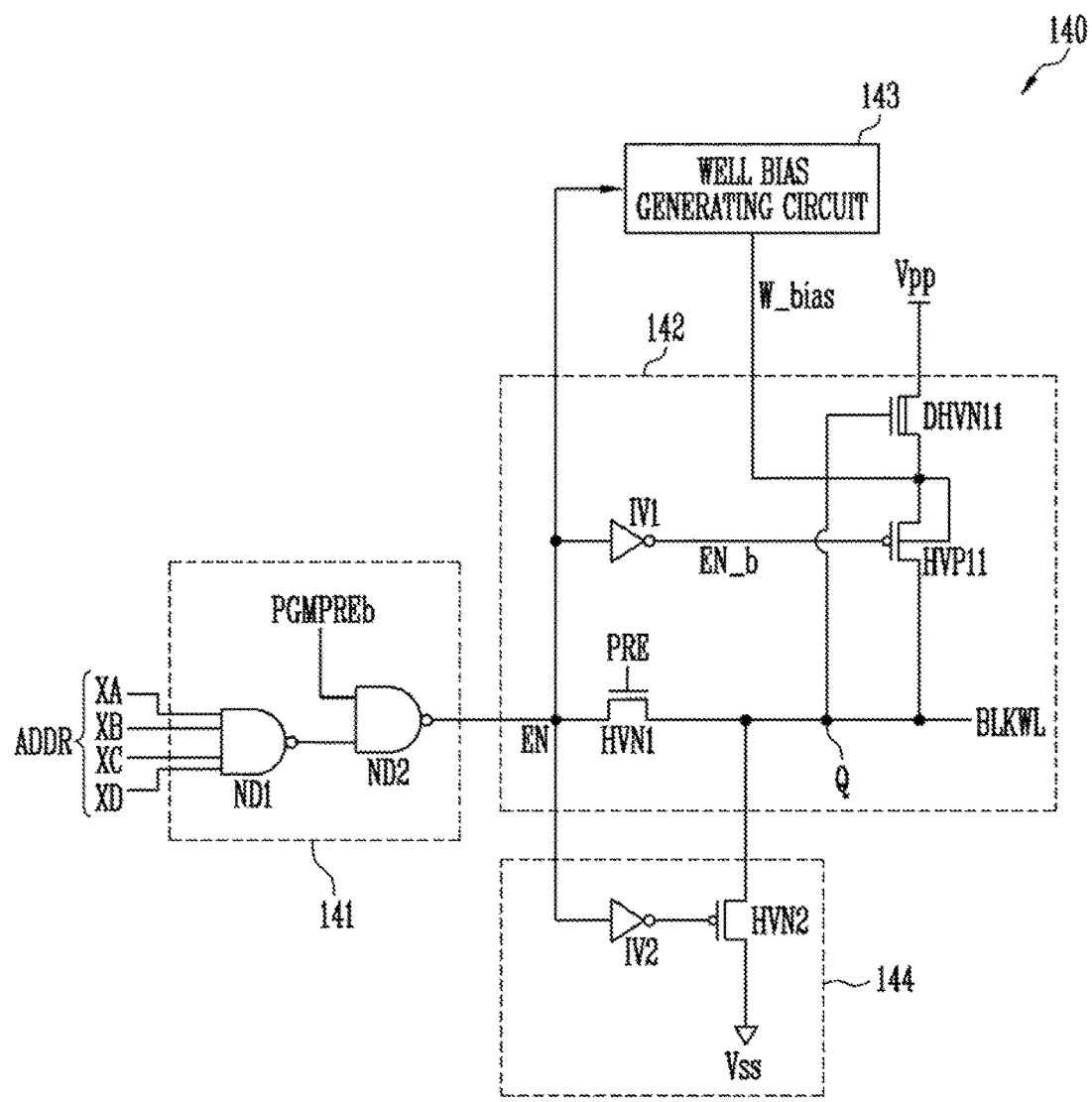
FIG. 3 is a detailed circuit diagram of a block switch illustrated in FIG. 2.

FIG. 3 is a detailed circuit diagram of the block switch 140 of FIG. 2.

Referring to FIG. 3, the block switch 140 may include a decoder circuit 141, a control signal generating circuit 142, a well bias generating circuit 143, and a discharge circuit 144.

The decoder circuit 141 may output the second enable signal EN in response to a plurality of decoded address signals ADDR (denoted as "XA", "XB", "XC", and "XD" in FIG. 3). The decoder circuit 141 includes NAND gates ND1 and ND2. The NAND gate ND1 logically combines the plurality of decoded address signals XA, XB, XC, and XD and outputs an output signal. The NAND gate ND2 outputs the second enable signal EN in response to the output signal of the NAND gate ND1 and a program precharge signal PGMPREb. For example, when the plurality of decoded address signals XA, XB, XC, and XD corresponds to a memory block, the second enable signal EN is output at a logic high level.

The control signal generating circuit 142 may be configured to be similar to the control signal generating circuit 11 illustrated in FIG. 1. The control signal generating circuit 142 may include a high voltage transistor HVN1, a depletion transistor DHVN11, a high voltage PMOS transistor HVP11, and an inverter IV1.

The high voltage transistor HVN1 may be turned on in response to a precharge signal PRE, and transmit the second enable signal EN to an internal node Q.

The depletion transistor DHVN11 and the high voltage PMOS transistor HVP11 may be serially connected between a terminal of a high voltage Vpp and the internal node Q. A gate of the depletion transistor DHVN11 may be connected to the node Q. The inverter IV1 may generate a first enable signal EN_b by reversing the second enable signal EN and may apply the generated first enable signal EN_b to the gate of the high voltage PMOS transistor HVP11.

When the second enable signal EN is applied at the logic high level and the first enable signal EN_b is applied at the logic low level, the HVN1 is turned on in response to a precharge signal PRE, so that the second enable signal EN is transmitted to the internal node Q and the potential level of the internal node Q is increased. The depletion transistor DHVN11 is turned on in response to the potential of the internal node Q, and the high voltage PMOS transistor HVP11 is turned on in response to the first enable signal EN_b, so that the potential of the internal node Q is increased by the high voltage Vpp.

When the second enable signal EN is applied at the logic low level and the first enable signal EN_b is applied at the logic high level, the depletion transistor DHVN11 and the HVN1 are in a turn-off state.

The well bias generating circuit 143 may apply a well bias W_bias to a well of the high voltage PMOS transistor HVP11 in response to the second enable signal EN. The well bias W_bias may have a voltage level lower than that of a threshold voltage of the high voltage PMOS transistor HVP11. The well bias generating circuit 143 may be configured to be similar to the well bias generating circuit 12 illustrated in FIG. 1.

The discharge circuit 144 may discharge the potential of the internal node Q to a ground power source Vss in response to the second enable signal EN. The discharge circuit 144 includes an inverter IV2 and a transistor HVN2. The inverter IV2 reverses the second enable signal EN and applies the reversed second enable signal EN to the gate of the transistor HVN2. The transistor HVN2 is connected between the internal node Q and the ground power source Vss, and discharges the potential of the internal node Q to the ground power source Vss in response to the signal reversed by the inverter IV2.

In the exemplary embodiment of FIG. 3, one block switch is disclosed, however, we note that the invention is not limited in this way. For example, in an embodiment, a plurality of block switches having the aforementioned structure of block switch 140 in an area adjacent to each other. In this case, the plurality of block switches may include one common well bias generating circuit 143 that is shared between the plurality of block switches. When the plurality of block switches share one well bias generating circuit 143, the well bias generating circuit 143 may be configured to be activated in response to a new enable signal other than the second enable signal EN, and the new enable signal may be designed to activate the well bias generating circuit 143 when at least one of the plurality of block switches is in a disable state.

As described above, when a plurality of block switches is employed, a well bias may be applied to the well of the high voltage PMOS transistor HVP11 included in an inactivated block switch, so that the block switch that is adjacent to the Inactivated block switch may be activated and a capacitance phenomenon is decreased even though a potential level of the well is increased by a high voltage switching operation of the high voltage PMOS transistor HVP11. Accordingly, the present invention can improve the degree of integration of the circuit by decreasing an interval between the wells of the high voltage PMOS transistors HVP11.

Figure 4:
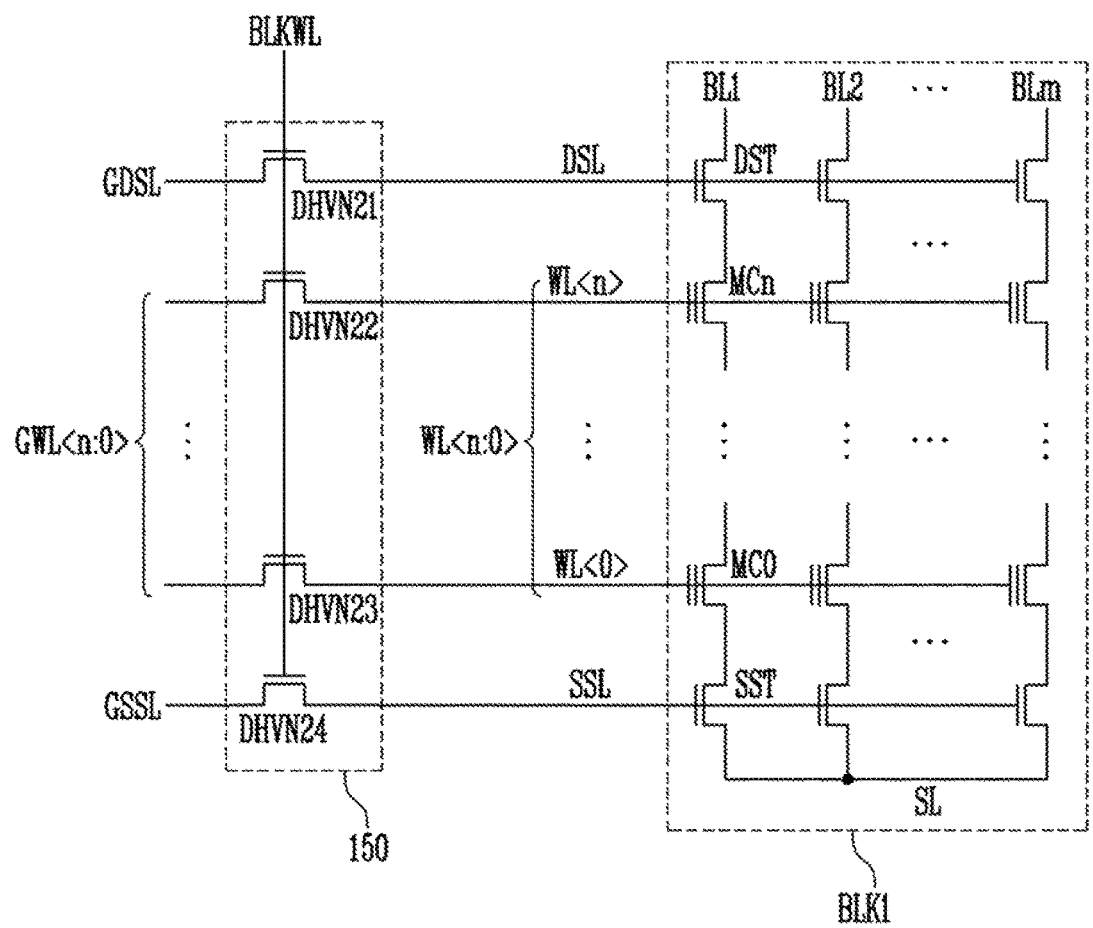
FIG. 4 is a detailed circuit diagram illustrating a path circuit and a memory block illustrated in FIG. 2.

FIG. 4 is a detailed circuit diagram Illustrating the path circuit 150 and the memory block of FIG. 2.

Referring to FIG. 4, the path circuit 150 may connect the global word lines GWL and the word lines WL in response to the block select signal BLKWL output from the block switch 140 of FIGS. 2 and 3. Further, the path circuit 150 respectively connects a global drain select line GDSL and a global source select line GSSL to a local drain select line DSL and a local source select line SSL of the memory block BLK1 in response to the block select signal BLKWL.

The path circuit 150 may include a plurality of transistors DHVN21 to DHVN24. The plurality of transistors DHVN21 to DHVN24 may be depletion transistors. For example, the transistor DHVN21 may be serially connected between the global drain select line GDSL and the drain select line DSL, and the transistor DHVN22 may be serially connected between the global word line GWL<n> and the word line WL<n>. The transistors DHVN21 to DHVN24 may be turned on in response to the block select signal BLKWL output from the block switch 140.

The memory block BLK1 may include a plurality of memory cells MC<n:0> connected to the plurality of word lines WL<n:0>. Further, the memory block BLK1 may include a drain transistor DST connected to the drain select line DSL and a source select transistor SST connected to the source select line SSL. The plurality of source select transistors may share the source line SL.

An operating method of the semiconductor memory device according to an exemplary embodiment of the present disclosure will be described now with reference to FIGS. 2 to 4.

1) A Case where an Operation Voltage is Applied to a Selected Memory Block

The decoder circuit 141 of the block switch 140 may output the second enable signal EN at the logic high level in response to the plurality of decoded address signals ADDR (XA, XB, XC, and XD).

The high voltage transistor HVN1 may be turned on in response to a precharge signal PRE, and transmit the second enable signal EN to the internal node Q. Accordingly, a potential level of the internal node Q is increased by a potential level of the second enable signal EN.

Then the depletion transistor DHVN11 may be turned on in response to the potential of the internal node Q, and the high voltage PMOS transistor HVP11 is turned on in response to the first enable signal EN_b being set at the logic low level, so that the potential of the internal node Q is increased to the high voltage Vpp.

Accordingly, the block switch 140 may output a block select signal BLKWL having the level of the high voltage Vpp.

In this case, the well bias generating circuit 143 is inactivated according to the second enable signal EN at the logic high level and does not generate a well bias W_bias.

The plurality of transistors DHVN21 to DHVN24 of the path circuit 150 may be turned on in response to the block select signal BLKWL having the level of the high voltage Vpp. Accordingly, the path circuit 150 may connect the global word lines GWL<n:0> with the word lines WL<n:0>, and the global drain and source select lines GDSL and GSSL with the local drain and source select lines DSL and SSL and may apply the generated operation voltages from the voltage providing circuit 130 to a selected memory block BLK1 among the plurality of memory blocks BLLK1 to BLKz of the memory cell array 110.

2) A Case where an Operation Voltage is Blocked to a Non-Selected Memory Block

The decoder circuit 141 of the block switch 140 may output the second enable signal EN at the logic low level in response to the plurality of decoded address signals ADDR (XA, XB, XC, and XD).

The high voltage transistor HVN1 may be turned on in response to the precharge signal PRE, but the internal node Q may be maintained at 0 V according to the second enable signal EN being set at the logic low level. The high voltage PMOS transistor HVP11 may be turned off in response to the first enable signal EN_b at a high level and may block the high voltage Vpp from being applied to the internal node Q. Accordingly, a block select signal BLKWL having a level of 0 may be outputted.

Further, the well bias generating circuit 143 may be activated in response to the second enable signal EN at the low level and may generate a well bias W_bias. The generated well bias W_bias may be applied to the well of the high voltage PMOS transistor HVP11 to improve a BV characteristic of the high voltage PMOS transistor HVP11.

The plurality of transistors DHVN21 to DHVN24 of the path circuit 150 may be turned off in response to the block select signal BLKWL having the level of 0V. Accordingly, the path circuit 150 may block the operation voltages which are generated in the voltage providing circuit 130 from being applied to the word lines WL and the local drain and source select lines of a non-selected block.

As described above, the block switch of a semiconductor memory device according to the present disclosure can apply a well bias to the well of the high voltage PMOS transistor HVP1, which switches a high voltage, thereby improving a BV characteristic of the high voltage PMOS transistor HVP11 when the block switch performs a turn-off operation.

Figure 5:
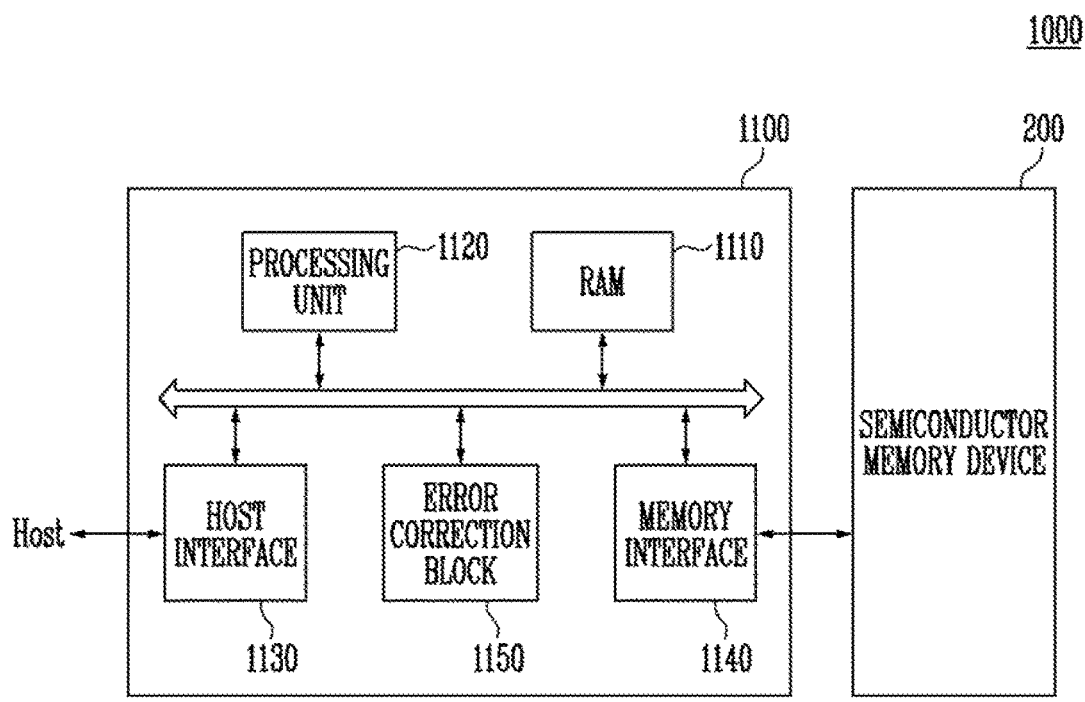
FIG. 5 is a block diagram illustrating a memory system including the semiconductor memory device of FIG. 2.

FIG. 5 is a block diagram illustrating a memory system 1000 including the semiconductor memory device of FIG. 2.

Referring to FIG. 5, the memory system 1000 may include a semiconductor memory device 200 and a controller 1100.

The semiconductor memory device 200 may be configured and operated in a similar manner to the semiconductor memory device 100 described with reference to FIG. 2. Hence, hereinafter, overlapping descriptions will be omitted.

The controller 1100 may be connected to a host and to the semiconductor memory device 200. The controller 1100 may be configured to access the semiconductor memory device 200 in response to a request from the host Host. For example, the controller 1100 may be configured to control the read, write, erase, and background operations of the semiconductor memory device 200. The controller 1100 may be configured to provide an interface between the semiconductor memory device 200 and the host Host. The controller 1100 may be configured to drive firmware for controlling the semiconductor memory device 200.

The controller 1100 may include a Random Access Memory (RAM) 1110, a processing unit 1120, a host interface 1130, a memory interface 1140, and an error correction block 1150. The RAM 1110 may be used as at least one among a working memory of the processing unit 1120, a cache memory between the semiconductor memory device 200 and the host Host, and a buffer memory between the semiconductor memory device 200 and the host Host. The processing unit 1120 may control a general operation of the controller 1100. Further, the controller 1100 may temporarily store program data provided from the host Host during the write operation.

The host interface 1130 may include a protocol for performing a data exchange between the host Host and the controller 1100. As an exemplified embodiment, the controller 1100 may be configured to communicate with the host Host through at least one of various interface protocols, such as a Universal Serial Bus (USB) protocol, a Multimedia Card (MMC) protocol, a Peripheral Component Interconnection (PCI) protocol, a PCI-express (PCI-E) protocol, an Advanced Technology Attachment (ATA) protocol, a Serial-ATA protocol, a Parallel-ATA protocol, a small computer small Interface (SCSI) protocol, an enhanced small disk interface (ESDI) protocol, and an Integrated Drive Electronics (IDE) protocol, and a private protocol.

The memory interface 1140 may provide an interface between the controller 1100 and the semiconductor memory device 200. Any suitable memory interface may be employed. For example, the memory interface may include a NAND interface or a NOR interface when the semiconductor device 200 is a NAND or a NOR flash memory, respectively.

The error correction block 1150 may use an error correcting code (ECC) to detect and correct an error in data received from the semiconductor memory device 200. The processing unit 1120 may adjust the read voltage according to an error detection result from the error correction block 1150, and control the semiconductor memory device 200 to perform re-reading. In an exemplary embodiment, the error correction block may be provided as an element of the controller 1100. Any suitable error correction code may be employed.

The controller 1100 and the semiconductor memory device 200 may be integrated into a single semiconductor device. In an exemplary embodiment, the controller 1100 and the semiconductor memory device 200 may be integrated into a single semiconductor device to form a memory card. For example, the controller 1100 and the semiconductor memory device 200 may be integrated into a single semiconductor device forming a memory card such as a personal computer memory card international association (PCMCIA), a compact flash card (CF), a smart media card (SM or SMC), a memory stick multimedia card (MMC, RS-MMC, or MMCmicro), an SD card (SD, miniSD, microSD, or SDHC), a universal flash storage (UFS), and the like.

The controller 1100 and the semiconductor memory device 200 may be integrated into a single semiconductor device to form a solid state drive (SSD). The SSD may include a storage device formed to store data in a semiconductor memory. When the memory system 1000 is used as an SSD, an operation speed of the host Host coupled to the memory system 1000 may be improved significantly.

In another embodiment, the memory system 1000 may be provided as an element of an electronic device such as a computer, an ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, and the like.

In an exemplary embodiment, the semiconductor memory device 200 or the memory system 1000 may be embedded in various types of packages. For example, the semiconductor memory device 200 or the memory system 1000 may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi-Chip Package (MCP), Wafer-level Fabricated Package (WFP), Wafer-Level Processed Stack Package (WSP), or the like.

Figure 6:
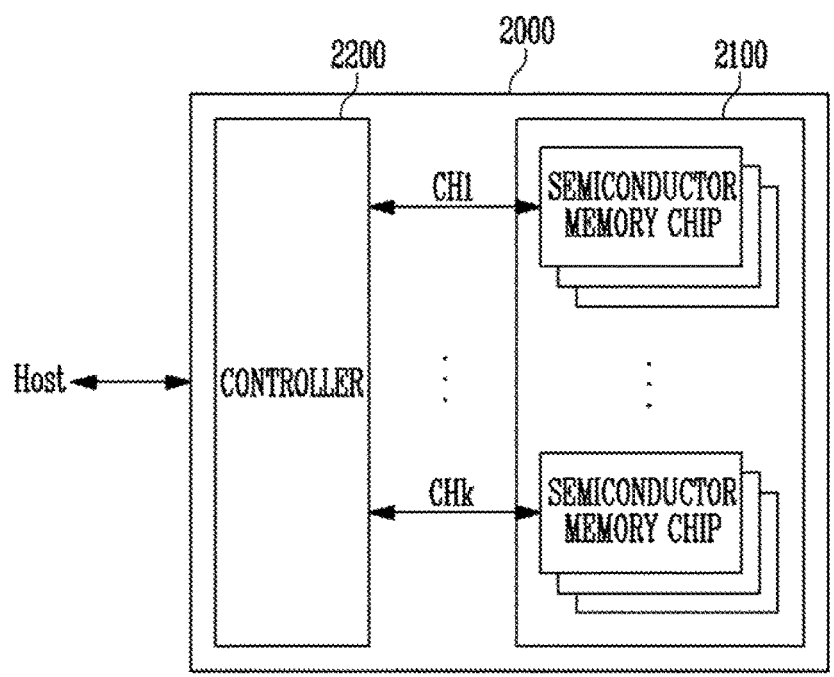
FIG. 6 is a block diagram Illustrating an application example of the memory system of FIG. 5.

FIG. 6 is a block diagram showing an application example of the memory system of FIG. 5.

Referring FIG. 6, a memory system 2000 may include a semiconductor memory device 2100 and a controller 2200. The semiconductor memory device 2100 may include a plurality of memory chips. The semiconductor memory chips may be divided into a plurality of groups.

In FIG. 6, it is Illustrated that each of the plurality of groups communicates with the controller 2200 through first to k-th channels CH1 to CHk. Each semiconductor memory chip may have the same configuration and operation as those of the semiconductor memory device 100 described with reference to FIG. 2.

Each group may communicate with the controller 2200 through one common channel. The controller 2200 may have the same configuration as that of the controller 1100 described with reference to FIG. 5 and may be configured to control a plurality of memory chips of the semiconductor memory device 2100 through the plurality of channels CH1 to CHk.

Figure 7:
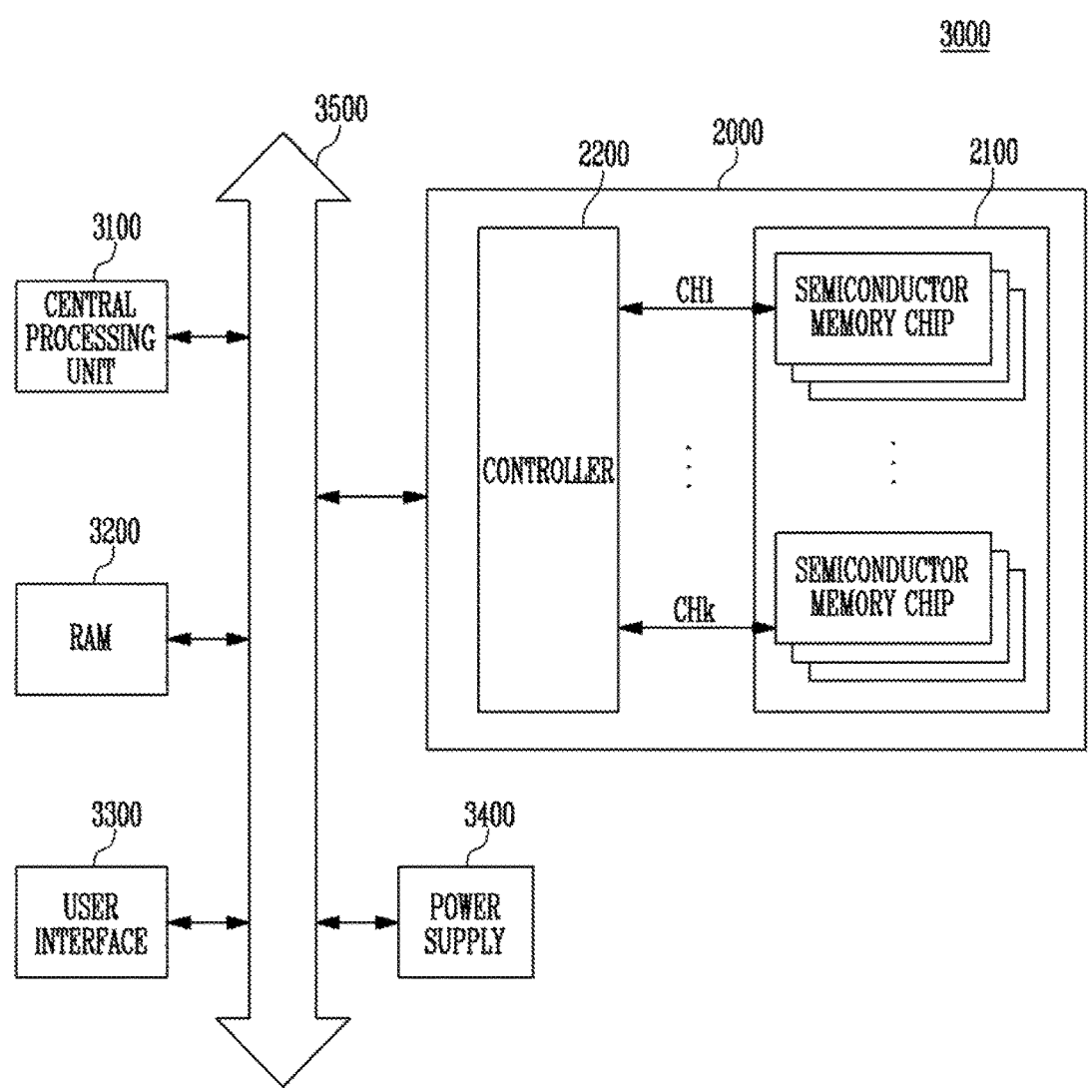
FIG. 7 is a block diagram Illustrating a computing system including the memory system described with reference to FIG. 6.

FIG. 7 is a block diagram showing a computing system 3000 including the memory system 2000 illustrated with reference to FIG. 6.

Referring to FIG. 7, the computing system 3000 may include a central processing unit 3100, a RAM 3200, a user interface 3300, a power supply 3400, a system bus 3500, and a memory system 2000.

The memory system 2000 may be electrically coupled to the CPU 3100, the RAM 3200, the user interface 3300, and the power supply 3400 through the system bus 3500. Data provided through the user interface 3300 or processed by the CPU 3100 may be stored in the memory system 2000.

In FIG. 7, the semiconductor memory device 2100 is illustrated as being coupled to the system bus 3500 through the controller 2200. However, the semiconductor memory device 2100 may be directly coupled to the system bus 3500 in which case the function of the controller 2200 may be performed by the CPU 3100 and the RAM 3200.

In FIG. 7, the memory system 2000 described with reference to FIG. 6 is being employed. However, the memory system 2000 may be replaced with the memory system 1000 described with reference to FIG. 5. In an embodiment, the computing system 3000 may include both of the memory systems 1000 and 2000 described with reference to FIGS. 5 and 6.

As described above, according to the present disclosure, during a program operation of a semiconductor memory device, voltages of word lines and select lines of an unselected memory block are controlled so that electrons are prevented from being trapped in a channel of the unselected memory block. Thereby, threshold voltage distribution of the unselected memory block may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A high voltage switching circuit, comprising:
a control signal generating circuit configured to supply a supply voltage to an internal node and generate a control signal in response to a first enable signal, the control signal generating circuit including a depletion transistor and a high voltage transistor, which are serially connected between the supply voltage and the internal node;

a well bias generating circuit configured to apply a well bias to a well of the high voltage transistor included in the control signal generating circuit in response to a second enable signal; and a switching circuit configured to switch an input voltage to an output voltage in response to the control signal, wherein the well bias has a voltage level lower than a threshold voltage of the high voltage transistor.

2. The high voltage switching circuit of claim 1, wherein a gate of the depletion transistor is connected to the internal node, the first enable signal is applied to a gate of the high voltage transistor, and the well bias is applied to the well of the high voltage transistor.

3. The high voltage switching circuit of claim 1, wherein the first enable signal and the second enable signal have a reverse relation.

4. A semiconductor memory device, comprising:

a memory cell array including a plurality of memory cells;

a path circuit configured to switch word lines and global word lines of the memory cell array in response to a block select signal; and a block switch configured to generate the block select signal in response to an address signal, wherein the block switch includes a control signal generating circuit for supplying a supply voltage to an internal node and generating the block select signal in response to a first enable signal, and a well bias generating circuit for applying a well bias to a well of a high voltage transistor for applying the supply voltage to the internal node, wherein the control signal generating circuit includes a depletion transistor and the high voltage transistor, which are serially connected between the supply voltage and the internal node, and wherein the well bias has a voltage level lower than a threshold voltage of the transistor.

5. The semiconductor memory device of claim 4, wherein the well bias generating circuit generates the well bias in response to a second enable signal, which has a reverse relation with the first enable signal.

6. The semiconductor memory device of claim 4, wherein a gate of the depletion transistor is connected to the internal node, the first enable signal is applied to a gate of the high voltage transistor, and the well bias is applied to the well of the high voltage transistor.

7. The semiconductor memory device of claim 4, wherein the memory cells are non-volatile memory cells.

8. A high voltage switch circuit for a semiconductor memory device, the high voltage switch circuit including:

a control signal generating circuit including a depletion transistor and a high voltage PMOS transistor serially connected between a terminal to which a high voltage is applied and a first internal node, the depletion transistor supplying the high voltage to a second internal node between the depletion transistor and the high voltage PMOS transistor in response to a potential level of the first internal node, and wherein a gate of the high voltage PMOS transistor controls transfer of a voltage supplied through the depletion transistor to the first internal node in response to a first enable signal;

a well bias generating circuit configured to apply a well bias to the second internal node in response to a second enable signal, the well bias having a voltage level lower than a threshold voltage of the high voltage PMOS transistor; and a switching circuit configured to switch an input voltage according to the potential level of the first node and outputting an output voltage.

9. The high voltage switch circuit of claim 8, wherein a well of the high voltage PMOS transistor is connected with the second internal node and wherein the potential level of the first internal node is outputted as a control signal.

10. The high voltage switch circuit of claim 8, wherein the second enable signal has a reverse relation with the first enable signal.

11. The high voltage switch circuit of claim 8, wherein the switching circuit includes a triple well transistor.

* * * * *